US012642070B2

(12) United States Patent
Chen et al.

(10) Patent No.: US 12,642,070 B2
(45) Date of Patent: May 26, 2026

(54) SEMICONDUCTOR DEVICE WITH SOURCE/DRAIN EPITAXIAL LAYER

(71) Applicant: Taiwan Semiconductor Manufacturing Company, Ltd., Hsinchu (TW)

(72) Inventors: Chia-Chung Chen, Keelung (TW); Chi-Feng Huang, Hsinchu County (TW); Victor Chiang Liang, Hsinchu City (TW); Chung-Hao Chu, Hsinchu (TW); Ching-Yu Yang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 65 days.

(21) Appl. No.: 18/657,752

(22) Filed: May 7, 2024

(65) Prior Publication Data

US 2024/0290652 A1      Aug. 29, 2024

Related U.S. Application Data

(60) Continuation of application No. 17/874,310, filed on Jul. 27, 2022, now Pat. No. 11,996,323, which is a
(Continued)

(51) Int. Cl.
*H01L 21/768*          (2006.01)
*H01L 21/324*          (2006.01)
(Continued)

(52) U.S. Cl.
CPC ...... *H01L 21/76814* (2013.01); *H01L 21/324* (2013.01); *H01L 21/76805* (2013.01);
(Continued)

(58) Field of Classification Search
CPC .. H10D 30/601; H10D 62/151; H10D 62/299; H10D 64/62; H10D 30/797;
(Continued)

(56) References Cited

U.S. PATENT DOCUMENTS 7,358,551 B2 *   4/2008   Chidambarrao ... H10D 84/0133
                                          257/E29.085
9,559,175 B2 *   1/2017   Usami ................. H01L 23/5222
(Continued)

FOREIGN PATENT DOCUMENTS

JP            2007280072 A   * 10/2007

*Primary Examiner* — Sonya McCall-Shepard
(74) *Attorney, Agent, or Firm* — JCIPRNET

(57) ABSTRACT

A semiconductor device includes a first gate stack structure over a substrate, a source/drain epitaxial layer, a lightly doped region, and a silicide region. The source/drain epitaxial layer is disposed in the substrate and adjacent to the first gate stack structure. The lightly doped region is located in the substrate to be electrically connected to the source/drain epitaxial layer. The lightly doped region includes a first portion protrudes from a sidewall of the source/drain epitaxial layer. The silicide region is in contact with a top surface and sidewalls of a top portion of the source/drain epitaxial layer and a top surface of the first portion of the lightly doped region. The top portion of the source/drain epitaxial layer is higher than the top surface of the first portion of the lightly doped region.

20 Claims, 8 Drawing Sheets

Related U.S. Application Data division of application No. 16/883,958, filed on May 26, 2020, now Pat. No. 11,443,980.

(60) Provisional application No. 62/906,744, filed on Sep. 27, 2019.

(51) Int. Cl.

| | |
|---|---|
| *H10D 30/01* | (2025.01) |
| *H10D 30/60* | (2025.01) |
| *H10D 30/69* | (2025.01) |
| *H10D 62/13* | (2025.01) |
| *H10D 62/17* | (2025.01) |
| *H10D 62/822* | (2025.01) |
| *H10D 64/01* | (2025.01) |
| *H10D 64/62* | (2025.01) |

(52) U.S. Cl.

CPC .. *H01L 21/76843* (2013.01); *H01L 21/76895* (2013.01); *H10D 30/601* (2025.01); *H10D 30/797* (2025.01); *H10D 62/151* (2025.01); *H10D 62/822* (2025.01); *H10D 64/62* (2025.01); *H10D 30/0212* (2025.01); *H10D 64/021* (2025.01)

(58) Field of Classification Search

CPC .. H10D 62/822; H10D 64/021; H10D 30/608; H10D 62/021; H10D 62/116; H10D 64/015; H10D 30/0229; H10D 30/6719; H10D 30/6721; H10D 30/0227; H10D 30/0212–0213; H10D 30/794; H10D 84/013; H01L 21/76805; H01L 21/76843; H01L 21/76895

See application file for complete search history.

(56) References Cited

U.S. PATENT DOCUMENTS

| | | | | |
|---|---|---|---|---|
| 9,917,083 | B2 * | 3/2018 | Kura | H10D 1/474 |
| 2009/0140351 | A1 * | 6/2009 | Lin | H10D 64/021 |
| | | | | 257/407 |
| 2012/0223397 | A1 * | 9/2012 | Yang | H10D 30/0227 |
| | | | | 257/411 |
| 2017/0141228 | A1 * | 5/2017 | Hsu | H10D 84/038 |

* cited by examiner

SEMICONDUCTOR DEVICE WITH SOURCE/DRAIN EPITAXIAL LAYER

CROSS-REFERENCE TO RELATED APPLICATION

This application is a continuation application of and claims the priority benefit of prior application Ser. No. 17/874,310, filed on. Jul. 27, 2022. The prior application Ser. No. 17/874,310 is a divisional application of and claims the priority benefit of U.S. application Ser. No. 16/883,958, filed on May 26, 2020. The U.S. application Ser. No. 16/883,958 claims the priority benefit of U.S. provisional application Ser. No. 62/906,744, filed on Sep. 27, 2019. The entirety of the above-mentioned patent application is hereby incorporated by reference herein and made a part of this specification.

BACKGROUND

A good understanding of the matching behavior of devices available in a particular integrated circuit (IC) technology is critical in designing ICs. With the advancements in technology leading to smaller feature sizes and more stringent design constraints, products with consistent performance become more important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
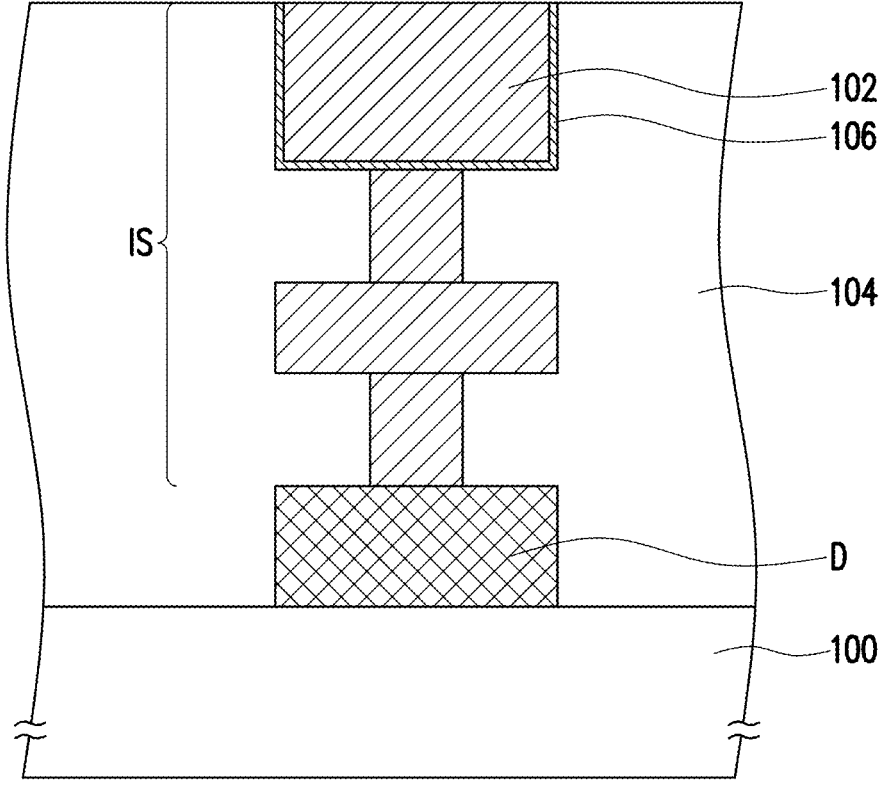
FIG. 1A to FIG. 1G are cross-sectional views illustrating various stages of a method of fabricating a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A is a cross-sectional view illustrating one stage of a method of fabricating a semiconductor device 10 in accordance with some embodiments of the disclosure. Referring to FIG. 1A, a substrate 100 is provided. The substrate 100 may be a semiconductor substrate, such as a bulk semiconductor substrate, a semiconductor-on-insulator (SOI) substrate, or the like. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used.

In some embodiments, the substrate 100 includes a crystalline silicon substrate (e.g., wafer). In some alternative embodiments, the semiconductor substrate 100 is made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. The substrate 100 may include various doped regions depending on design requirements (e.g., p-type semiconductor substrate or n-type semiconductor substrate). The doped regions may be doped with p-type or n-type dopants. For example, the doped regions may be doped with p-type dopants, such as boron (B) or $BF_2$; n-type dopants, such as phosphorus or arsenic; and/or a combination thereof. The dopant concentration in various doped regions may be different. In addition, depending on product design requirements, a desired device D may be formed on the substrate 100. The desired device D may be an active device (e.g., a transistor or the like) or a passive device (e.g., a capacitor, an inductor, or the like). The device D may be a long gate length (e.g., Long-Lg=0.24 um) transistor, a middle gate length (e.g., Middle-Lg=0.1 um) transistor, or a short gate length (e.g., Short-Lg=0.03 um) transistor. The transistor is, for example, a planar metal-oxide-semiconductor field-effect transistor (MOSFET), a FinFET, or a nanowire FET.

As illustrated in FIG. 1A, a metal layer 102 and dielectric layer 104 are formed on the substrate 100. The metal layer 102 may be a top metal layer of an interconnect structure IS. The material of the metal layer 102 may include copper (Cu), aluminum (Al), or tungsten (W). The metal layer 102 may be formed by, for example, electro-chemical plating process, chemical vapor deposition (CVD), plasma enhanced chemical vapor deposition (PECVD), physical vapor deposition (PVD), a combination thereof, or the like. The metal layer 102 may be electrically connected to the device D disposed on the substrate 100 by the other portion of the interconnect structure IS.

The metal layer 102 may be formed in the dielectric layer 104. In some embodiments, the material of the dielectric layer 104 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the material of the dielectric layer 104 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 104 may include one or more dielectric materials and/or one or more dielectric layers. The dielectric layer 104 may be formed to a suitable thickness by Flowable Chemical Vapor Deposition (FCVD), CVD, High Density Plasma Chemical Vapor Deposition (HDPCVD), Sub Atmospheric Chemical Vapor Deposition (SACVD), spin-on, sputtering, or other suitable methods.

In some embodiments, a barrier layer 106 is formed between the metal layer 102 and dielectric layer 104. The material of the barrier layer 106 includes titanium (Ti), titanium nitride (TiN), tantalum (Ta), tantalum nitride (TaN), or a combination thereof. The barrier layer 106 may be formed by, for example, PVD or ALD. It should be noted that the barrier layer 106 illustrated in FIG. 1A may be omitted in some alternative embodiments.

Figure 1B:
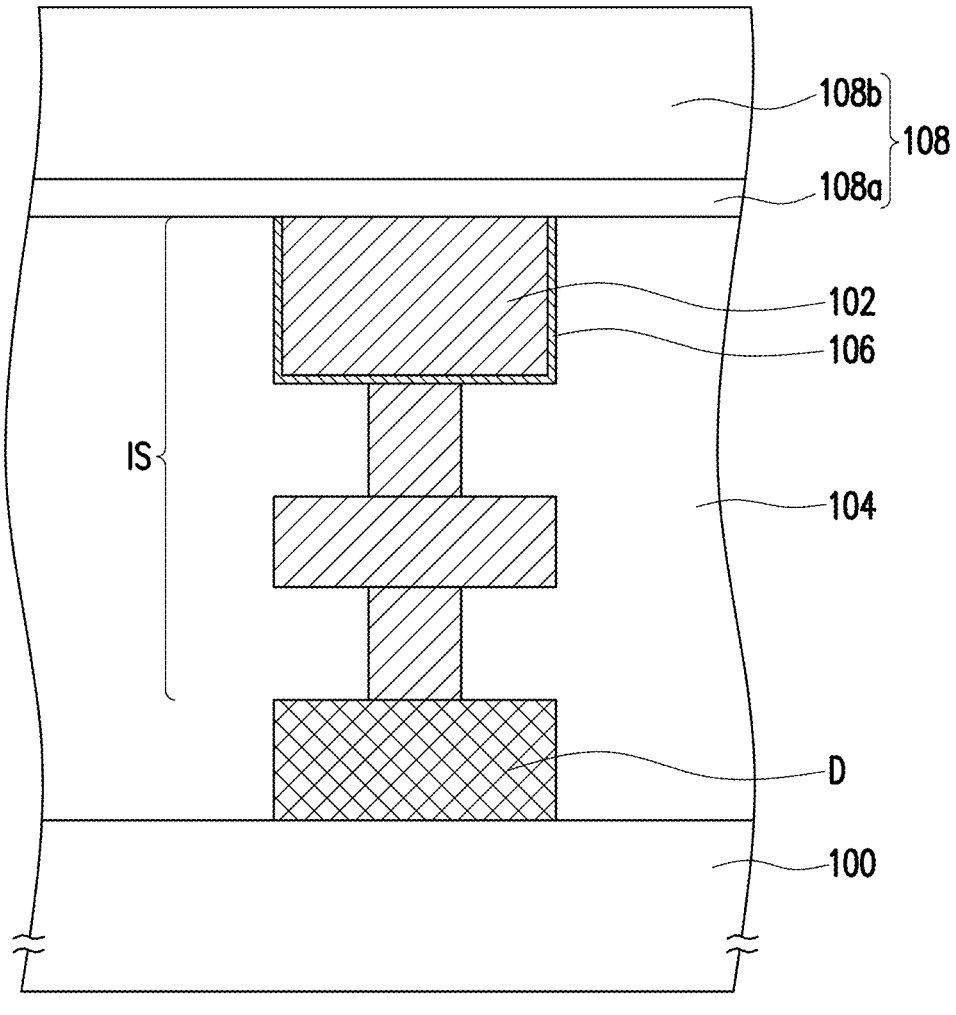

FIG. 1B is a cross-sectional view illustrating one stage of a method of fabricating a semiconductor device 10 in accordance with some embodiments of the disclosure. Referring to FIG. 1B, a dielectric layer (or referred to as a passivation layer) 108 is formed over the substrate 100. For example, the dielectric layer 108 may be formed on the dielectric layer 104 and the metal layer 102. In some alternative embodiments, the material of the dielectric layer 108 includes silicon oxide, silicon nitride, silicon oxynitride, PSG, BPSG, SOG, FSG, carbon doped silicon oxide (e.g., SiCOH), polyimide, and/or a combination thereof. In some alternative embodiments, the material of the dielectric layer 108 includes low-k dielectric materials. Examples of low-k dielectric materials include BLACK DIAMOND®, Xerogel, Aerogel, amorphous fluorinated carbon, Parylene, BCB, Flare, SILK®, HSQ or SiOF, and/or a combination thereof. It is understood that the dielectric layer 108 may include one or more dielectric materials and/or one or more dielectric layers. For example, the dielectric layer 108 includes a dielectric layer 108a and a dielectric layer 108b disposed on the dielectric layer 108a. In some embodiments, the material of the dielectric layer 108a is silicon nitride, and material of the dielectric layer 108b is silicon oxide. The dielectric layer 108 may be formed to a suitable thickness by FCVD, CVD, HDPCVD, SACVD, spin-on, sputtering, or other suitable methods.

Figure 1C:
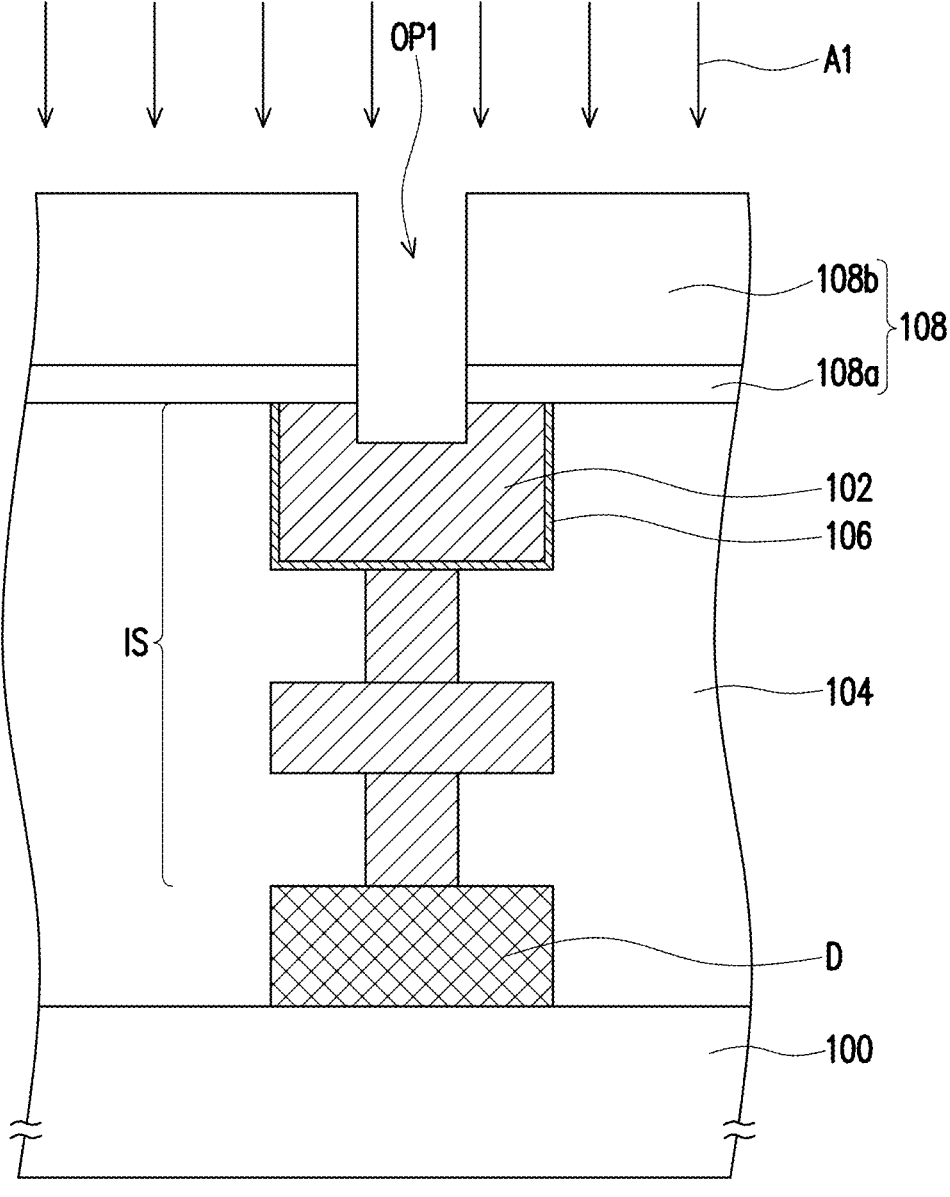

FIG. 1C is a cross-sectional view illustrating one stage of a method of fabricating a semiconductor device 10 in accordance with some embodiments of the disclosure. Referring to FIG. 1C, the dielectric layer 108 is patterned, thereby forming an opening OP1 exposing the metal layer

102. The dielectric layer 108 may be patterned by a lithography process and an etching process. The above-mentioned etching process may be a dry etching process. The method of forming opening OP1 may include performing a main etching process on the dielectric layer 108, and then performing an over-etching process after performing the main etching process. In some embodiments, the main etching process and the over-etching process are controlled by time mode. In some alternative embodiments, the main etching process is performed by using the dielectric layer 108a as an etch stop layer, and then the over-etching process is performed to remove the dielectric layer 108a and to expose the metal layer 102. In some embodiments, a portion of the metal layer 102 may be removed during the over-etching process. The radio frequency (RF) power of the over-etching process may be greater than the RF power of the main etching process and less than three times the RF power of the main etching process. When the RF power of the etching process is less, the etching speed will be lower, and the etching process can be better controlled. For example, the RF power of the over-etching process may be 2 to 3 times the RF power of the main etching process. A ratio of a thickness of the metal layer 102 removed by the over-etching process to an entire thickness of the metal layer 102 may range from 1/5 to 1/3.

An annealing process (or referred to as an alloy process) A1 may be performed after forming the opening OP1. Thereby, the defects generated in the etching process for forming opening OP1 may be repaired by the annealing process A1. In some embodiments, the annealing process A1 may be performed in an atmosphere of a gas including a $H_3PO_4/HNO_3$ mixture. In some embodiments, the annealing process A1 may be performed at a temperature between 400° C. and 800° C. for 30 minutes to 4 hours.

Figure 1D:
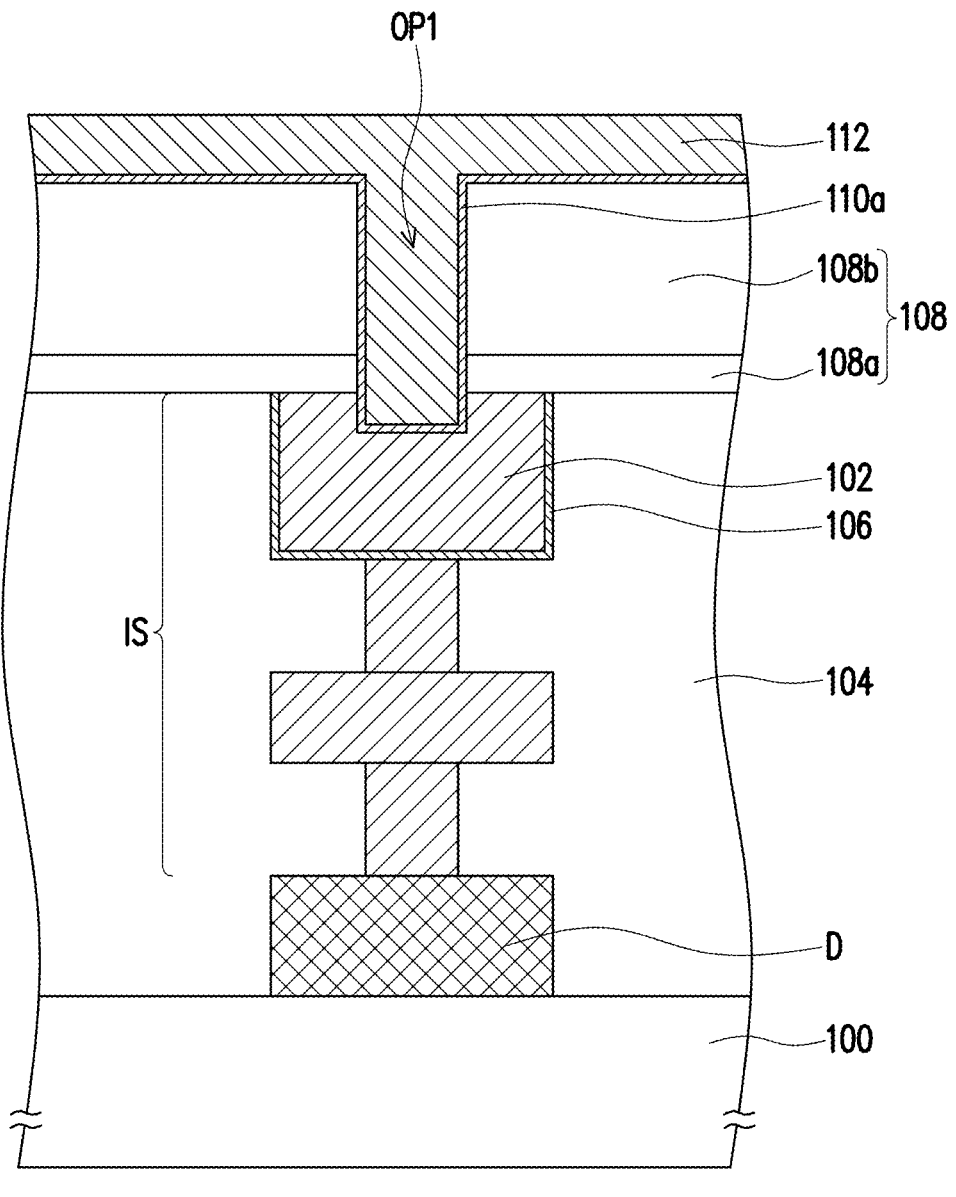

FIG. 1D is a cross-sectional view illustrating one stage of a method of fabricating a semiconductor device 10 in accordance with some embodiments of the disclosure. Referring to FIG. 1D, a barrier layer 110 may be formed on the dielectric layer 108 and on the surface of the opening OP1. In some embodiments, the material of the barrier layer 110 includes Ti, TiN, Ta, TaN, or a combination thereof, and formed by, for example, PVD or ALD. It should be noted that the barrier layer 110 illustrated in FIG. 1D may be omitted in some alternative embodiments.

As illustrated in FIG. 1D, a metal layer 112 is formed on the dielectric layer 108 and filling into the opening OP1. The metal layer 112 may be formed on the barrier layer 110. In some embodiments, the material of the metal layer 112 includes A1 or W, and is formed by electro-chemical plating process, CVD, PECVD, PVD, a combination thereof, or the like.

Figure 1E:
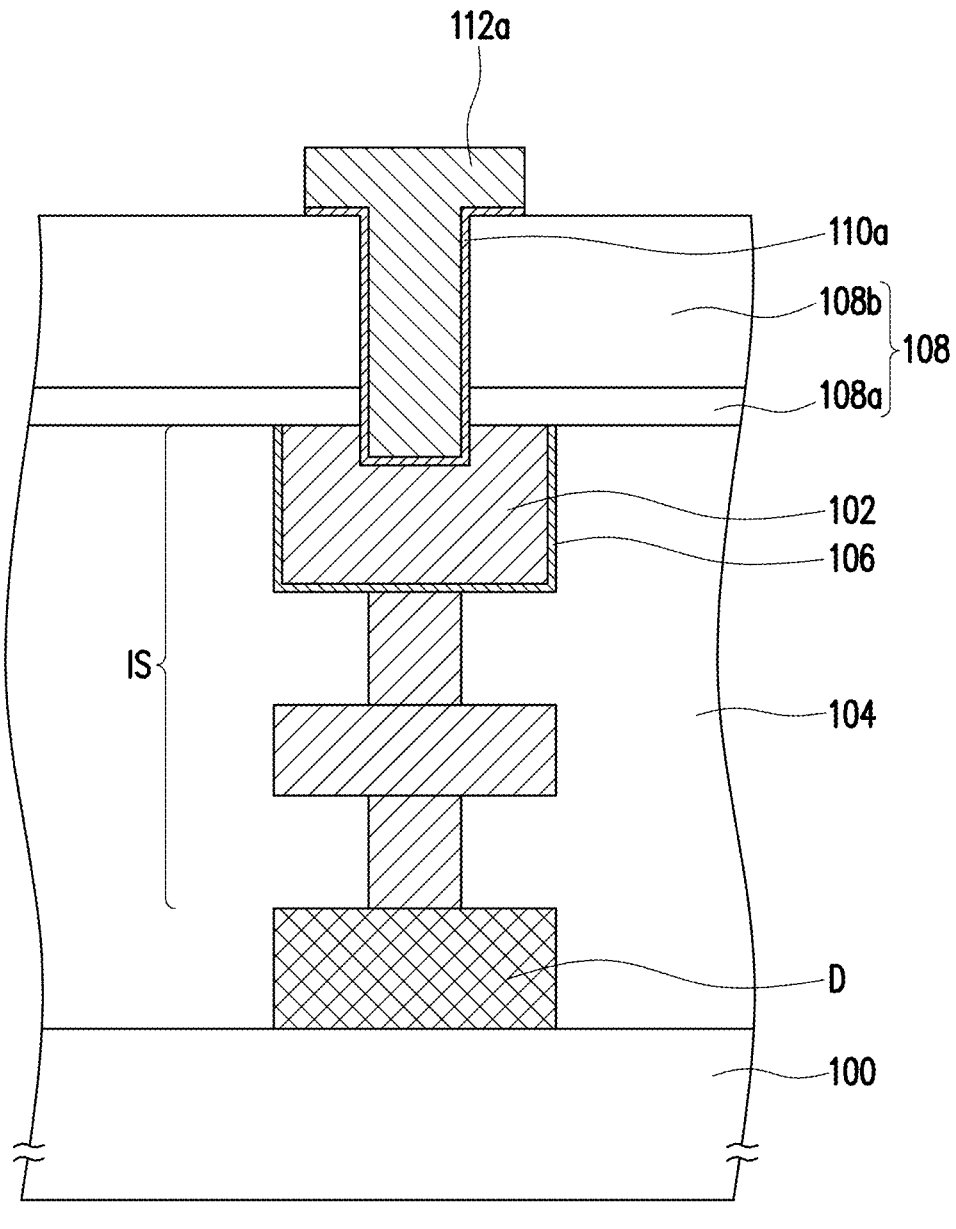

FIG. 1E is a cross-sectional view illustrating one stage of a method of fabricating a semiconductor device 10 in accordance with some embodiments of the disclosure. Referring to FIG. 1E, the metal layer 112 is patterned, thereby forming a metal pad 112a. The barrier layer 110 may be patterned, thereby forming a barrier layer 110a. In some embodiments, the metal layer 112 and the barrier layer 110 are patterned by a lithography process and an etching process. The above-mentioned etching process may be a dry etching process.

Figure 1F:
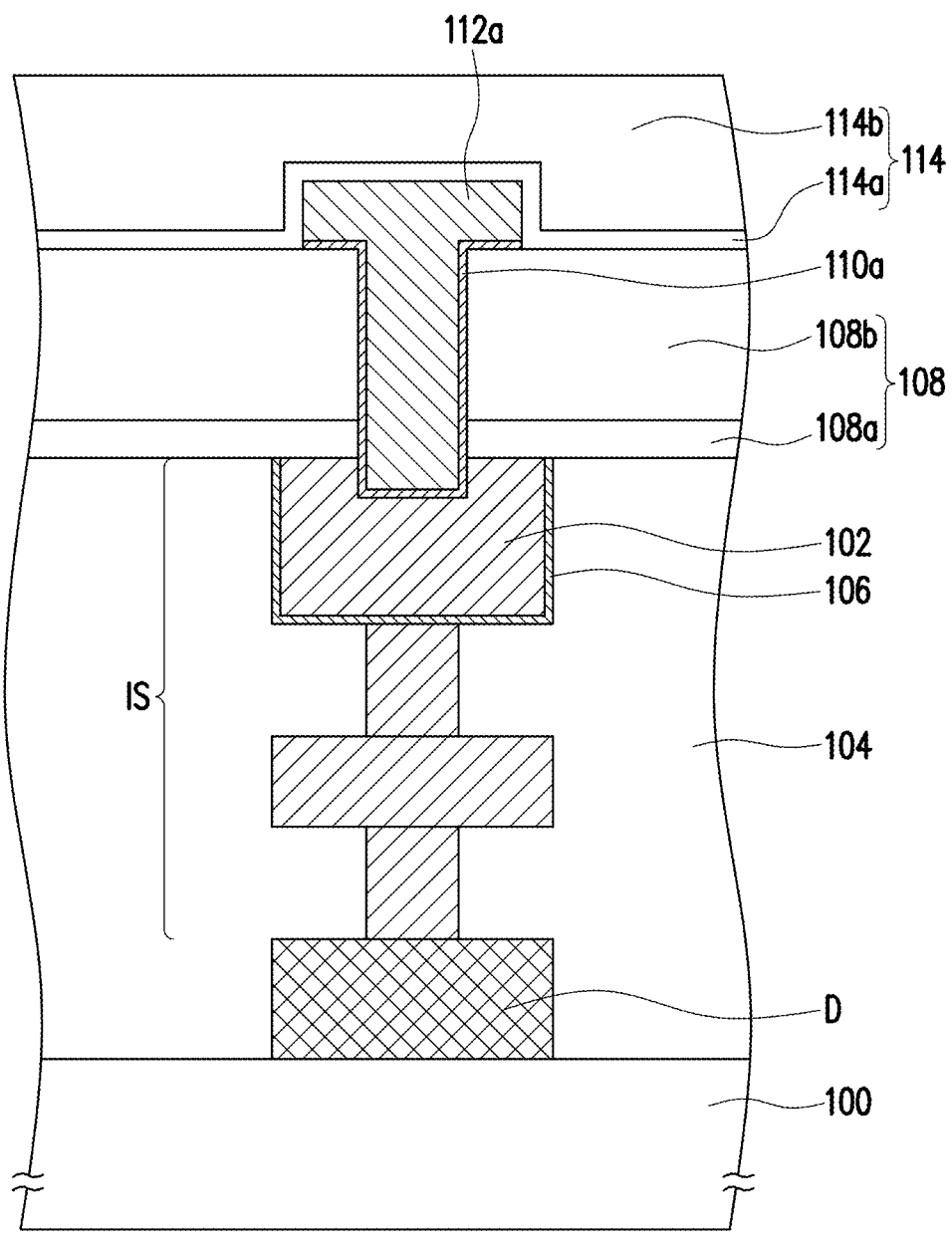

FIG. 1F is a cross-sectional view illustrating one stage of a method of fabricating a semiconductor device 10 in accordance with some embodiments of the disclosure. Referring to FIG. 1F, a dielectric layer (or referred to as a passivation layer) 114 is formed on the dielectric layer 108 and the metal pad 112a. In some embodiments, the material of the dielectric layer 114 includes silicon oxide, silicon nitride, silicon oxynitride, PSG, BPSG, SOG, FSG, carbon doped silicon oxide (e.g., SiCOH), polyimide, and/or a combination thereof. In some alternative embodiments, the material of the dielectric layer 114 includes low-k dielectric materials. Examples of low-k dielectric materials include BLACK DIAMOND®, Xerogel, Aerogel, amorphous fluorinated carbon, Parylene, BCB, Flare, SILK®, HSQ or SiOF, and/or a combination thereof. It is understood that dielectric layer 114 may include one or more dielectric materials and/or one or more dielectric layers. For example, the dielectric layer 114 includes a dielectric layer 114a and a dielectric layer 114b disposed on the dielectric layer 114a. In some embodiments, the material of the dielectric layer 114a is silicon nitride, and material of the dielectric layer 114b is silicon oxide. The dielectric layer 114 may be formed to a suitable thickness by FCVD, CVD, HDPCVD, SACVD, spin-on, sputtering, or other suitable methods.

Figure 1G:
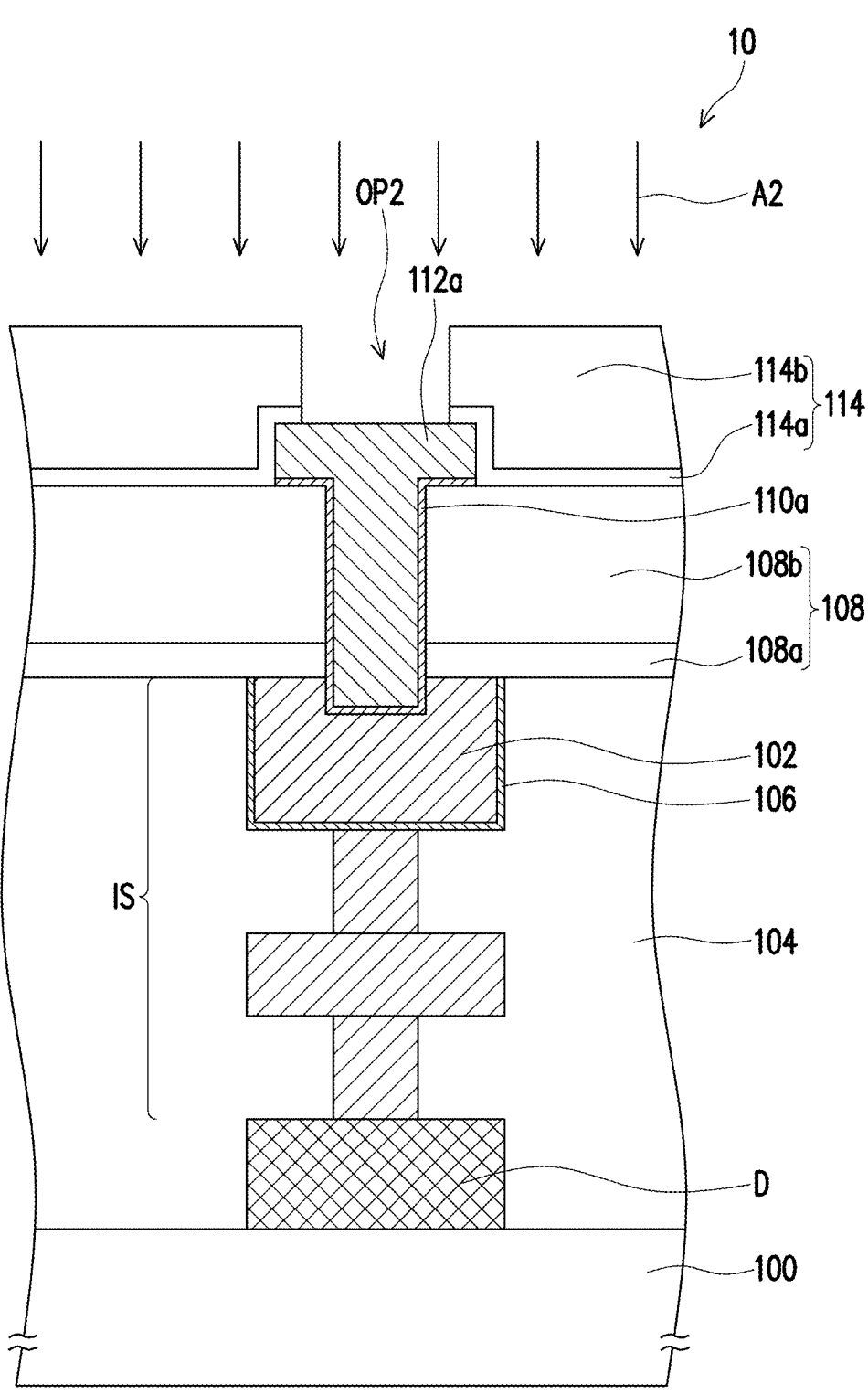

FIG. 1G is a cross-sectional view illustrating one stage of a method of fabricating a semiconductor device 10 in accordance with some embodiments of the disclosure. Referring to FIG. 1G, the dielectric layer 114 is patterned, thereby forming an opening OP2 exposing the metal pad 112a. In some embodiments, the opening OP2 exposes a portion of the top surface of the metal pad 112a. That is, the dielectric layer 114 may cover a portion of the top surface of the metal pad 112a. In some alternative embodiments, the opening OP2 exposes the entire top surface of the metal pad 112a. That is, the dielectric layer 114 may not cover the top surface of the metal pad 112a. The dielectric layer 114 may be patterned by, for example, a lithography process and an etching process. The above-mentioned etching process may be a dry etching process.

Furthermore, after patterning the dielectric layer 114, an annealing process A2 is performed to the semiconductor device 10. The annealing process A2 may be referred to as an ally process. The extra charges at the semiconductor/dielectric interface generated during the previous process may be removed by the annealing process A2, thereby reducing the device to device electrical characterization mismatch (e.g., ultra low threshold voltage PMOS (uLVTP) mismatch or standard threshold voltage PMOS (SVTP) mismatch) which is random happened in the wafer. In some embodiments, the annealing process A2 is performed in an atmosphere of a gas including 50 vol % to 100 vol % of hydrogen ($H_2$). The annealing process A2 may be performed in the atmosphere of the gas including 100 vol % of hydrogen (i.e., pure hydrogen ($H_2$)). In alternative embodiments, the gas may further include nitrogen ($N_2$), oxygen ($O_2$), an inert gas (e.g., helium (He)), or a combination thereof. The annealing process A2 may be performed at a temperature between 350° C. and 500° C. The annealing process A2 is performed for, for example, 20 minutes to 2 hours. A heating rate of the annealing process A2 ranges, for example, from 40° C./min to 60° C./min.

Figure 2:
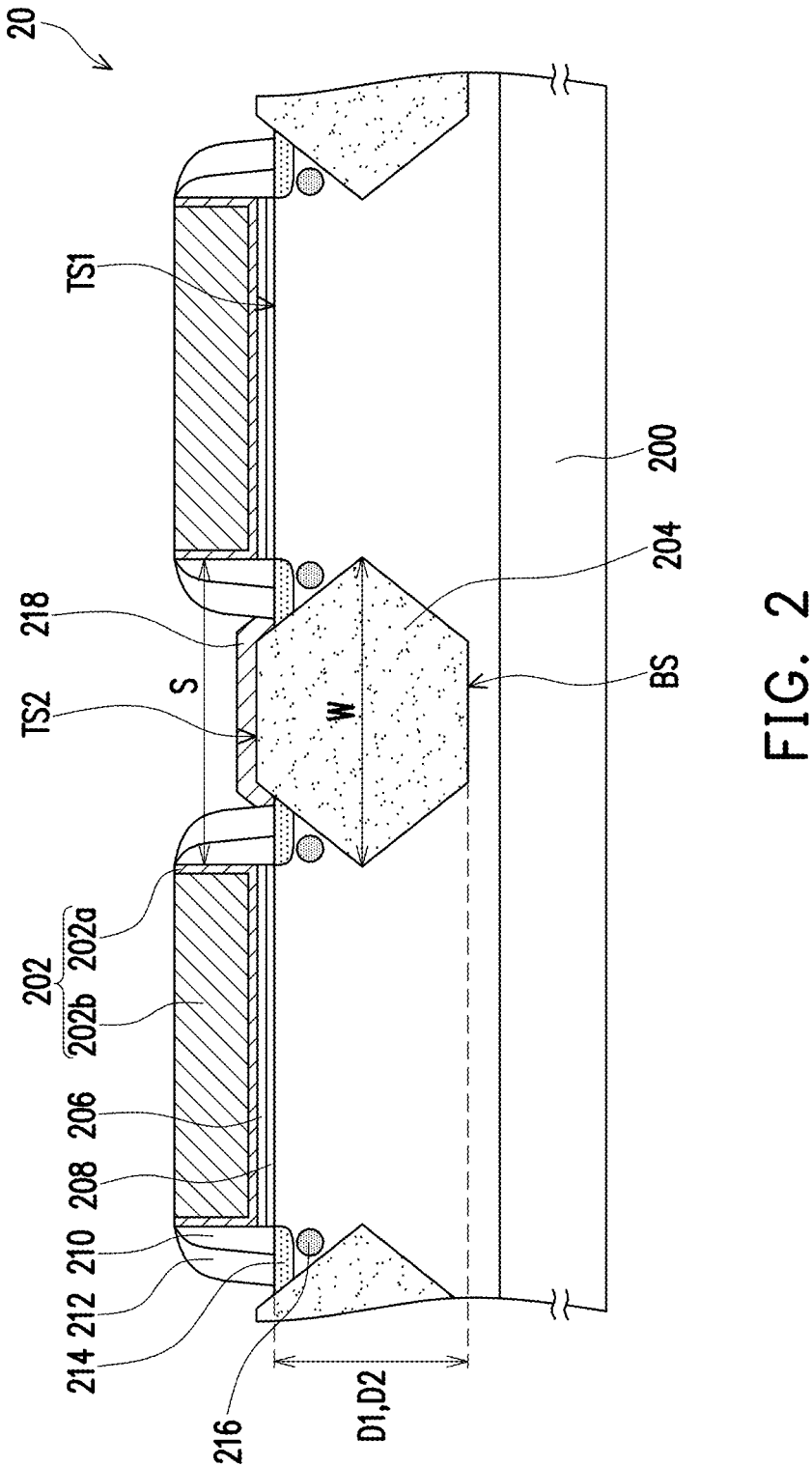
FIG. 2 is a cross-sectional view illustrating a semiconductor device in accordance with some embodiments of the disclosure.

FIG. 2 is a cross-sectional view illustrating a semiconductor device 20 in accordance with some embodiments of the disclosure. Referring to FIG. 2, a semiconductor device 20 may include a substrate 200, a plurality of gate electrodes 202, and a source/drain epitaxial layer 204. The semiconductor device 20 may be a transistor. The semiconductor device 20 may be a long gate length (Long-Lg) transistor, a middle gate length (Middle-Lg) transistor, or a short gate length (Short-Lg) transistor. The semiconductor device 20 may be a planar P-type Metal-Oxide-Semiconductor (PMOS) or a P-type FinFET. The semiconductor device 20 may be a high-k metal gate (HKMG) transistor. The substrate 200 may be a semiconductor substrate, such as a bulk semiconductor substrate, a semiconductor-on-insulator (SOI) substrate, or the like. Generally, an SOI substrate is a layer of a semiconductor material formed on an insulator layer. The insulator layer may be, for example, a BOX layer, a silicon oxide layer, or the like. The insulator layer is provided on a substrate, typically a silicon or glass substrate. Other substrates, such as a multi-layered or gradient substrate, may also be used.

In some embodiments, the substrate 200 includes a crystalline silicon substrate (e.g., wafer). In some alternative embodiments, the semiconductor substrate 200 is made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP.

As illustrated in FIG. 2, the gate electrodes 202 are disposed on the substrate 200. The gate electrode 202 may be a single-layered structure or a multi-layered structure. The gate electrode 202 may be a metal gate, but the disclosure is not limited thereto. In some embodiments, the gate electrode 202 is formed by a gate-last process. For example, the gate electrode 202 may be a multi-layered structure including a work function metal layer 202a and a metal layer 202b formed by the gate-last process, and the work function metal layer 202a may have a U-shape (as shown in FIG. 2), but the disclosure is not limited thereto. In some alternative embodiments, the gate electrode 202 is formed by the gate-first process, and the work function metal layer 202a may have a flat shape (not shown).

In some embodiments, the work function metal layer 202a is tuned to have the proper work function. For example, if a p-type work function metal (p-metal) for a PMOS device is desired, p-type work function materials may be used. In alternative embodiments, the material of the work function metal layer 202a includes p-type work function materials. Examples of the p-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials. The work function metal layer 202a may be formed by, for example, CVD, PVD, and/or other suitable processes.

In some embodiments, the metal layer 202b is disposed on the work function metal layer 202a. The material of the metal layer 202b may include a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. The metal layer 202b may be formed by, for example, CVD, PVD, plating, and/or other suitable processes.

The source/drain epitaxial layer 204 is disposed in the substrate 200 and between two adjacent gate electrodes 202. The bottom surface BS of the source/drain epitaxial layer 204 is buried in the substrate 200 to a depth D1 less than or equal to two-thirds of a spacing S between the two adjacent gate electrodes 202. In some embodiments, the bottom surface BS of the source/drain epitaxial layer 204 is buried in the substrate 200 to the depth D1 of one-half to two-thirds of the spacing S between the two adjacent gate electrodes 202. For example, when the spacing S is 0.03 μm, the distance D1 ranges from 0.015 μm to 0.02 μm. The spacing S between the two adjacent gate electrodes 202 is referred to a minimum distance between the conductive layer of one of the two adjacent gate electrodes 202 and the conductive layer of the other of the two adjacent gate electrodes 202. In some embodiments, a distance D2 from the bottom surface BS of the source/drain epitaxial layer 204 to the top surface TS1 of the substrate 200 is less than or equal to two-thirds of the spacing S between the two adjacent gate electrodes 202. For example, the distance D2 from the bottom surface BS of the source/drain epitaxial layer 204 to the top surface TS of the substrate 200 may be in a range from one-half to two-thirds of the spacing S between the two adjacent gate electrodes 202. For example, when the spacing S is 0.03 μm, the distance D2 ranges from 0.015 μm to 0.02 μm. The device mismatch (e.g., uLVTP mismatch or SVTP mismatch) can be reduced by the setting manner of the depth D1 or the distance D2. For example, the device mismatch can be reduced by about 25% to 35%. A maximum width W of the source/drain epitaxial layer 204 may be less than twice the spacing S between the two adjacent gate electrodes 202. The top surface TS2 of the source/drain epitaxial layer 204 may be higher than the top surface TS1 of the substrate 200.

In some embodiments, the source/drain epitaxial layer 204 is a silicon-germanium (SiGe) structure, and the content of germanium (Ge) in the SiGe structure may be in a range from 30 atom % to 80 atom %. The SiGe structure may be formed of a single layer or multiple layers having different composition. The source/drain epitaxial layer 204, such as the SiGe structure, may be formed by an epitaxy or epitaxial (epi) process with p-type dopants for straining a p-type transistor. That is, the source/drain epitaxial layer 204 may be doped with the p-type dopants to be the source and the drain of the p-type transistor. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, or other applicable epi processes. The epi process may use gaseous and/or liquid precursors, which may interact with the composition of substrate 200.

The semiconductor device 20 may further include a high-k dielectric layer 206. The high-k dielectric layer 206 may be disposed between the gate electrode 202 and the substrate 200. The material of the high-k dielectric layer 206 may include a material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanium oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). In some embodiments, the high-k dielectric layer 206 is formed by high-k first process, and the high-k dielectric layer 206 may have a flat shape (as shown in FIG. 2). In some alternative embodiments, the high-k dielectric layer 206 is formed by high-k last process, and the high-k dielectric layer 206 may have a U-shape (not shown). Whether the high-k dielectric layer 206 has the flat shape or the U-shape, the spacing S between the two adjacent gate electrodes 202 is referred to a minimum distance between the conductive layer of one of the two adjacent gate electrodes 202 and the conductive layer of the other of the two adjacent gate electrodes 202. The high-k dielectric layer 206 may be formed by, for example, CVD, ALD, PECVD, or plasma enhanced ALD (PEALD).

The semiconductor device 20 may further include an interfacial layer 208. The interfacial layer 208 may be disposed between the high-k dielectric layer 206 and the substrate 200. The material of the interfacial layer 206 may include silicon oxide. The interfacial layer 208 may be formed by, for example, chemical oxide technique, thermal oxide procedure, ALD or CVD.

The semiconductor device 20 may further include spacers 210. The spacers 210 may be disposed on the sidewalls of the gate electrode 202. The semiconductor device 20 may further include spacers. The spacers 212 may disposed on the spacers 210. The material of the spacers 210 and spacers 212 may include silicon oxide, silicon nitride, silicon oxynitride, and/or other applicable dielectric materials. The spacers 210 and spacers 212 may be formed by depositing one or multiple dielectric layers over substrate 200, and then performing an etching back process on the dielectric layer. That is, the spacers 210 and the spacers 212 may be formed of a single layer or multiple layers. The semiconductor device 20 may further include lightly doped drains (LDDs) 214. The LDDs 214 may be located in the substrate 200 and below the spacers 210 and the spacers 212. The semiconductor device 20 may further include pocket regions 216. The pocket regions 216 may be located in the substrate 200 and below the LDDs 214. The LDDs 214 and the pocket regions 216 may have different conductive types. For example, when the semiconductor device 20 is the PMOS transistor, the conductive type of the LDDs 214 is p-type, and the conductive type of the pocket regions 216 is n-type. The semiconductor device 20 may further include a silicide region 218. For example, when the source/drain epitaxial layer 204 is a SiGe structure, the 218 may be formed by blanket depositing a metal layer (not shown), which may include nickel, platinum, palladium, vanadium, titanium, cobalt, tantalum, titanium, ytterbium, zirconium, and combinations thereof. The substrate is then heated, which causes silicon and germanium to react with the metal layer where they are in contact. After the reaction, a layer of metal silicide and/or metal germano-silicide is formed between silicon/germanium and metal. The un-reacted metal layer is then removed.

In some embodiments, in a method of fabricating a semiconductor device, an annealing process is performed in an atmosphere of a gas including 50 vol % to 100 vol % of hydrogen to remove extra charges generated from the previous processes, thereby decreasing the device mismatch without extra mask. In alternative embodiments, a semiconductor device has a shallow source/drain epitaxial layer by setting a depth of a bottom surface of the source/drain epitaxial layer buried in a substrate, thereby decreasing the device mismatch without extra mask.

In accordance with some embodiments of the disclosure, a semiconductor device includes a first gate stack structure over a substrate, a source/drain epitaxial layer, a lightly doped region, and a silicide region. The source/drain epitaxial layer is disposed in the substrate and adjacent to the first gate stack structure. The lightly doped region is located in the substrate to be electrically connected to the source/drain epitaxial layer. The lightly doped region includes a first portion protrudes from a sidewall of the source/drain epitaxial layer. The silicide region is in contact with a top surface and sidewalls of a top portion of the source/drain epitaxial layer and a top surface of the first portion of the lightly doped region. The top portion of the source/drain epitaxial layer is higher than the top surface of the first portion of the lightly doped region.

In accordance with some alternative embodiments of the disclosure, a semiconductor device includes a semiconductor substrate, a plurality of gate stack structures disposed on the semiconductor substrate, a SiGe epitaxial structure, a plurality of lightly doped regions, and a silicide region. The SiGe epitaxial structure is disposed in the semiconductor substrate and between two adjacent gate stack structures. The plurality of lightly doped regions are located in the semiconductor substrate. The plurality of lightly doped regions include first portions, and the first portions are not overlap with the SiGe epitaxial structure. The silicide region is in contact with a top surface and a sidewall of the SiGe epitaxial structure and top surfaces of the first portions of the plurality of lightly doped drain regions.

In accordance with some alternative embodiments of the disclosure, a semiconductor device includes a substrate, a plurality of dielectric layers over the substrate, a plurality of interfacial layers, a plurality of gate electrodes, a source/drain epitaxial layer, and a plurality of lightly doped regions. The plurality of interfacial layers are between the plurality of dielectric layers and the substrate. The plurality of gate electrodes are disposed over the plurality of dielectric layers, and include a plurality of metal layers and a plurality of work function metal layers surrounding bottoms and side-walls of the plurality of metal layers. The source/drain epitaxial layer is disposed in the substrate and between two adjacent gate electrodes. The silicide region is located on a top surface of the source/drain epitaxial layer. The plurality of lightly doped regions is located in the substrate to be electrically connected to the source/drain epitaxial layer. The plurality of lightly doped regions include first portions and second portions, and the first portions protrude from sidewalls of the source/drain epitaxial layer and covered by the silicide region. The plurality of pocket regions are located in the substrate and between the second portions of the plurality of lightly doped regions and the source/drain epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprises:
a first gate stack structure over a top surface of a substrate;
a source/drain epitaxial layer disposed in the substrate and adjacent to the first gate stack structure;
a lightly doped region located in the substrate to be electrically connected to the source/drain epitaxial layer, wherein the lightly doped region comprises a first portion protrudes from a sidewall of the source/drain epitaxial layer;
a silicide region being in contact with a top surface and sidewalls of a top portion of the source/drain epitaxial layer and a top surface of the first portion of the lightly doped region, wherein the top portion of the source/drain epitaxial layer is higher than the top surface of the first portion of the lightly doped region; and
a pocket region located in the substrate and partially overlapped with the source/drain epitaxial layer in a direction perpendicular to the top surface of the sub-strate.

2. The semiconductor device according to claim 1, wherein a bottom portion of the source/drain epitaxial layer is buried in the substrate.

3. The semiconductor device according to claim 2, wherein a middle width of the bottom portion of the source/drain epitaxial layer is larger a top width the top portion of the source/drain epitaxial layer and a bottom width of the bottom portion the source/drain epitaxial layer.

4. The semiconductor device according to claim 3, wherein the middle width of the bottom portion of the source/drain epitaxial layer is a maximum width of the source/drain epitaxial layer.

5. The semiconductor device according to claim 4, wherein the maximum width of the source/drain epitaxial layer is less than twice a spacing between the first gate stack structure to an adjacent second gate stack structure.

6. The semiconductor device according to claim 1, wherein the source/drain epitaxial layer comprises a SiGe epitaxial structure.

7. The semiconductor device according to claim 2,
wherein the pocket region is located between a second portion of the lightly doped regions and the bottom portion of the source/drain epitaxial layer.

8. A semiconductor device comprises:
a semiconductor substrate;
a plurality of gate stack structures disposed on a top surface of the semiconductor substrate;
a SiGe epitaxial structure disposed in the semiconductor substrate and between two adjacent gate stack struc-tures;
a plurality of lightly doped regions located in the semi-conductor substrate, wherein the plurality of lightly doped regions comprises first portions, and the first portions are not overlap with the SiGe epitaxial struc-ture;
a silicide region being in contact with a top surface and a sidewall of the SiGe epitaxial structure and top surfaces of the first portions of the plurality of lightly doped regions; and
a plurality of pocket regions located in the semiconductor substrate and partially overlapped with the SiGe epi-taxial structure in a direction perpendicular to the top surface of the semiconductor substrate.

9. The semiconductor device according to claim 8, further comprising:
a plurality of spacers on sidewalls of the plurality of gate stack structures, wherein the plurality of spacers com-prise:
a plurality of first spacers on sidewalls of the plurality of gate stack structures; and
a plurality of second spacers on sidewalls of the plu-rality of first spacers,
wherein the plurality of first spacers and the plurality of second spacers cover second portions of the lightly doped region.

10. The semiconductor device according to claim 9, wherein the plurality of second spacers is sandwiched between the plurality of first spacers and portions of the silicide region, and the plurality of first spacers and the plurality of second spacers are in contact with second portions of the plurality of lightly doped regions.

11. The semiconductor device according to claim 10, wherein the portions of the silicide region are located between the plurality of second spacers and the SiGe epi-taxial structure.

12. The semiconductor device according to claim 11, wherein a maximum width of the SiGe epitaxial structure is larger than a top width of the SiGe epitaxial structure and a bottom width of the SiGe epitaxial structure.

13. The semiconductor device according to claim 12, wherein the maximum width of the SiGe epitaxial structure is less than twice a spacing between the two adjacent gate stack structures.

14. The semiconductor device according to claim 12, wherein the gate stack structures further comprise:

a plurality of dielectric layers over the top surface of the semiconductor substrate; and a plurality of interfacial layers between the plurality of dielectric layers and the semiconductor substrate, wherein the plurality of gate stack structures comprises:

a plurality of metal layers; and a plurality of work function metal layers sandwiched between the plurality of dielectric layers and the plurality of metal layers and surrounding sidewalls of the plurality of metal layers.

15. The semiconductor device according to claim 14, wherein a distance from a bottom surface of the SiGe epitaxial structure to the top surface of the semiconductor substrate is in a range from one-half to two-thirds of a spacing between two adjacent work function metal layers of the two adjacent gate stack structures.

16. A semiconductor device comprises:

a substrate;

a plurality of dielectric layers over the substrate;

a plurality of interfacial layers between the plurality of dielectric layers and the substrate;

a plurality of gate electrodes disposed over the plurality of dielectric layers comprising:

a plurality of metal layers; and a plurality of work function metal layers surrounding bottoms and sidewalls of the plurality of metal layers; and a source/drain epitaxial layer disposed in the substrate and between two adjacent gate electrodes;

a silicide region on a top surface of the source/drain epitaxial layer; and a plurality of lightly doped regions located in the substrate to be electrically connected to the source/drain epitaxial layer, wherein the plurality of lightly doped regions comprises first portions and second portions, and the first portions protrude from sidewalls of the source/drain epitaxial layer and covered by the silicide region; and a plurality of pocket regions located in the substrate and between the second portions of the plurality of lightly doped regions and the source/drain epitaxial layer.

17. The semiconductor device according to claim 16, wherein a maximum width of the source/drain epitaxial layer is less than twice a spacing between the two adjacent work function metal layers.

18. The semiconductor device according to claim 16, further comprising:

a plurality of spacers on sidewalls of the plurality of gate electrodes, wherein the second portions are located below the plurality of spacers.

19. The semiconductor device according to claim 18, wherein the second portions of the plurality of lightly doped regions are located between the plurality of spacers and the plurality of pocket regions.

20. The semiconductor device according to claim 19, wherein the plurality of pocket regions is sandwiched between the second portions of the plurality of lightly doped regions and the source/drain epitaxial layer.

\* \* \* \* \*